United States Patent [19]

Tajima et al.

[11] Patent Number: 5,998,089
[45] Date of Patent: Dec. 7, 1999

[54] PHOTOSENSITIVE RESIN COMPOSITION COMPRISING FULLERENE

[75] Inventors: Yusuke Tajima, Tokyo; Tadahiro Ishii; Kazuo Takeuchi, both of Saitama, all of Japan

[73] Assignee: The Institute of Physical and Chemical Research, Saitama, Japan

[21] Appl. No.: 08/928,337

[22] Filed: Sep. 12, 1997

[30] Foreign Application Priority Data

Sep. 13, 1996 [JP] Japan ................................. 8-243450

[51] Int. Cl.$^6$ .............................. G03C 1/492; C08J 3/28
[52] U.S. Cl. ...................... 430/270.1; 430/927; 522/113
[58] Field of Search ............................ 430/270.1, 927; 522/113, 125

[56] References Cited

U.S. PATENT DOCUMENTS 5,561,026  10/1996  Aoki ........................................ 430/196

FOREIGN PATENT DOCUMENTS

| | | |
|---|---|---|
| 4321547 | 1/1994 | Germany . |
| 4344840 | 7/1995 | Germany . |
| 134413 | of 1985 | Japan . |
| 33751 | of 1985 | Japan . |
| 62105 | of 1985 | Japan . |
| 6-242543 | 9/1994 | Japan . |
| 07084337 | 3/1995 | Japan . |
| 08283199 | 10/1996 | Japan . |

OTHER PUBLICATIONS

Smilowitz, L., Physical Review B, 47 (20) p. 13835, May 15, 1993.
Akashi, K.Y., Synthetic Metals, 70 p. 1317, 1995.
Yamakoshi, Y., J.Org.Chem., 61, p. 7236, Oct. 18, 1996.
JAPIO, WPAT English abstracts for JP 08283199.
CAPLUS,WPAT English abstracts for DE 4344840.
WPAT English abstract for JP 07084337.
Nie, B. et al., Tetrahedron Lett. 36 (21) p. 3617, 1995.

*Primary Examiner*—Janet Baxter
*Assistant Examiner*—Rosemary Ashton
*Attorney, Agent, or Firm*—Burns, Doane, Swecker & Mathis, LLP

[57] ABSTRACT

Disclosed are a photosensitive resin composition containing a fullerene and a polymer compound bearing a functional group which can react with the fullerene under irradiation of visible light; method for forming negative-type picture elements comprising steps of: forming a layer composed of the above composition, irradiating the layer with visible light through a photo mask having a pattern transmitting the visible light as a part of the mask to cure portions of the layer irradiated by the visible light, and removing uncured portions of the layer to form a resist film having cured portions of the pattern: and a method for producing devices comprising steps of: forming a layer of the above composition on an image-forming layer provided on a substrate, irradiating the layer with visible light through a photo mask having a pattern transmitting the visible light as a part of the mask to cure portions of the layer irradiated by the visible light, removing uncured portions of the layer to form a resist film having cured portions of the pattern, etching exposed portions of the image-forming layer, and removing the resist film. The composition and methods of the present invention enable production of negative type picture elements and devices with light of visible range.

7 Claims, 1 Drawing Sheet

PHOTOSENSITIVE RESIN COMPOSITION COMPRISING FULLERENE

BACKGROUND OF THE INVENTION

1. Field of the Invention

The present invention relates to a photosensitive resin composition containing a Fullerton as photosensitive crosslinking agent. More precisely, it relates to a photosensitive resin composition which is photo-curable even with light of visible range. The photosensitive resin composition of the present invention is useful as, for example, a photo resist used in the fields of semiconductor devices, liquid crystal elements and the like.

2. Related Art

As negative type resists for the production of semiconductors, liquid crystal display elements and the like, for example, mixtures of a photo-activated radical generating agent such as stilbazole-denatured polyvinyl alcohol and benzophenone and a multivalent acrylate are used. Upon use of this type of resists, they are cured by irradiation by a light source of g-ray (436 nm), i-ray (366 nm) or the like.

Resists utilizing fullerenes have also been known. For example, Japanese Patent Unexamined Publication No. Hei 6-167812 (JP-A-167812/84) discloses a photosensitive composition comprising a Fullerton and a photosensitive material. Japanese Patent Unexamined Publication No. Hei 6-19136 (JP-A-19136/84) discloses a photosensitive material obtained by introducing photosensitive groups into a fullerene. Japanese Patent Unexamined Publication No. Hei 7-134413 (JP-A-134413/85) discloses a process for making devices utilizing a resist material containing a fullerene. These compositions or process are basically for producing films by linking fullerenes one another and require a large amount of fullerenes. However, fullerenes are presently expensive materials and, therefore, the production of photoresists using these compositions is not practical.

Japanese Patent Unexamined Publication No. Hei 7-62105 (JP-A-62105/85) discloses a fullerene-containing silicon polymer, and describes that the polymer is a photosensitive resin containing fullerenes in its backbone and its photosensitivity is obtained by the silicon atoms contained in the backbone.

In order to cure these resists, irradiation of ultra-violet ray or radioactive ray of shorter wavelength is needed. While it becomes easier to form finer patterns by using a radioactive ray of shorter wavelength, it requires irradiation of a larger quantity of radioactive ray when a radioactive ray absorber such as carbon black is contained in the resists. On the other hand, if not so fine patterns are needed and the resist can be cured with light of visible range, it is not necessary to use the hazardous radioactive ray of short wavelength.

Therefore, an object of the present invention is to provide a novel photosensitive resin composition utilizing a relatively small amount of Fullerton and curable with light of visible range.

Another object of the present invention is to provide a method for forming negative type picture elements utilizing the photosensitive resin composition and method for producing devices.

SUMMARY OF THE INVENTION

The present invention provides a photosensitive resin composition containing a Fullerton and a polymer compound bearing a functional group which can react with the Fullerton under irradiation of visible light.

The present invention also provides a method for forming negative-type picture elements comprising steps of:

forming a layer containing a Fullerton and a polymer compound bearing a functional group which can react with the fullerene under irradiation of visible light, irradiating the layer with visible light through a photo mask having a pattern transmitting the visible light as a part of the mask to cure portions of the layer irradiated by the visible light, and removing uncured portions of the layer to form a resist film having cured portions of the pattern.

The present invention further provides a method for producing devices comprising steps of:

forming a layer containing a Fullerton and a polymer compound bearing a functional group which can react with the fullerene under irradiation of visible light on an image-forming layer provided on a substrate, irradiating the layer with visible light through a photo mask having a pattern transmitting the visible light as a part of the mask to cure portions of the layer irradiated by the visible light, removing uncured portions of the layer to form a resist film having cured portions of the pattern, etching exposed portions of the image-forming layer, and removing the resist film.

DETAILED DESCRIPTION OF THE INVENTION

Figure 1:
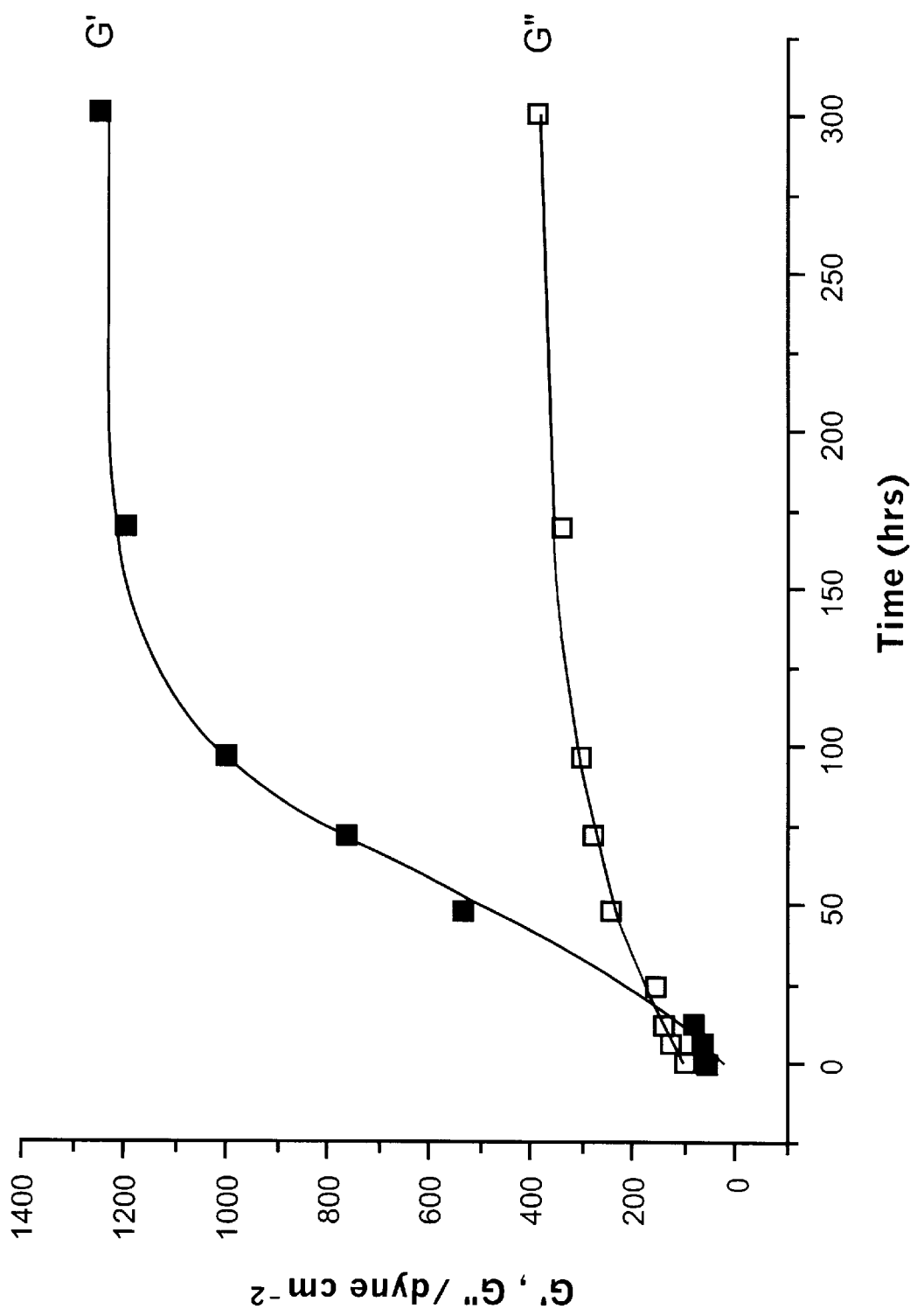
FIG. 1 shows the results of measurement of storage elastic modulus G' and loss elastic modulus G" in Example 4.

Fullerene has a molecule composed of carbon atoms and having an internal hollowness. For the purpose of the present invention, any known fullerenes such as $C_{60}$ composed of 60 carbon atoms, $C_{70}$ composed of 70 carbon atoms and $C_{82}$ composed of 82 carbon atoms can be used without any specific limitation.

In the term "polymer compound bearing a functional group which can react with Fullerton under irradiation of visible light", the functional group which can react with Fullerton under irradiation of visible light preferably means a functional group having a half oxidation potential ($E_{1/2}$ (ox)) (V vs SCE) of 1.8 or more. Such a functional group may be, for example, a substituted or unsubstituted heterocycle such as furan ring, thiophene ring and pyrrole ring. These heterocycles may be unsubstituted or have a substituent.

Reactivity of the functional group with a fullerene can be controlled by varying the half oxidation potential, which in turn can be varied by changing kind and number of the substituents. The substituent maybe, for example, alkyl ester such as carboxymethyl and carboxyethyl or CHO— group, but not limited to these. Other than the heterocycles, primaryamines, secondary amines, tertiary amines, anthracenes, enones, benzoins and the like can be the "functional group which can react with Fullerton under irradiation of visible light". The polymer used for the present invention is a polymer introduced with at least one functional group selected from these functional groups per molecule.

The backbone of the polymer compound is not particularly limited and it may be, for example, but not limited to, a poly(meth)acrylic acid, polyvinyl alcohol, polyimide or the like.

Such polymer compounds can be prepared by a known method. For example, a polymer compound having heterocycles on its side chains can be prepared by using furfuryl alcohol according to a known method such as described in New Experimental Chemistry Vol. 19 [I], p333, edited by Japan Chemical Society. More specifically, a poly (methacrylic acid furan ester) can be produced by the method represented by the following scheme:

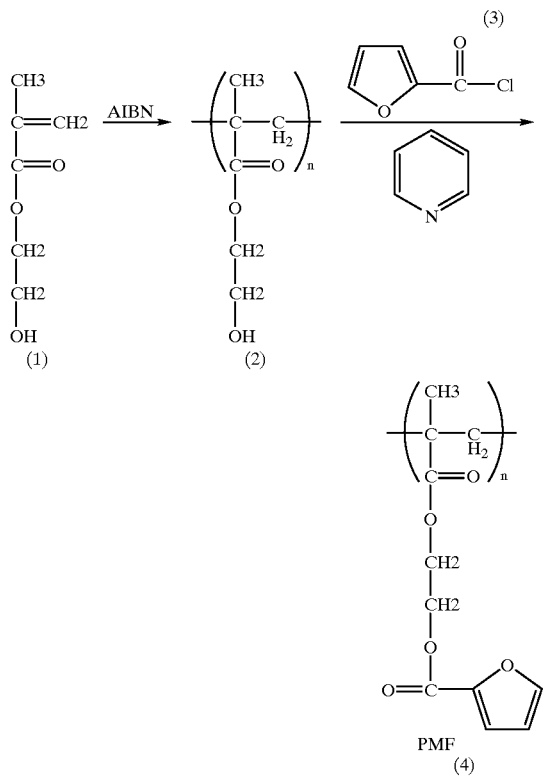

In the above scheme, 2-hydroxyethyl methacrylate (1) is first polymerized in the presence of a polymerization initiator, azobisisobutyronitrile (AIBN), to afford poly(2-hydroxyethyl methacrylate) (2). By adjusting the conditions of this polymerization, molecular weight of the resulting polymer compound can be controlled. Subsequently, the poly(2-hydroxyethyl methacrylate) (2) and 2-furoyl chloride (3) are reacted in pyridine to afford poly(methacrylic acid furan ester) (4). By adjusting the amount of reactive 2-furoyl chloride (3), ratio of introduced furan ester groups and 2-hydroxyethyl groups can be controlled.

The composition of the present invention can further contain a solvent which can solubilize the above Fullerton and the polymer compound. Such a solvent may be, for example, at least one of benzene, toluene, xylene, chlorobenzene, 1,2-dichlorobenzene, 1,2,4-trichlorobenzene, benzonitrile, chloronaphthalene, dichloromethane, chloroform, 1,2-dichloroethane, 1,1,2,2,-tetrachloroethane, decalin and the like.

The ratio of the above fullerene and the polymer compound in the composition of the present invention may be suitably decided considering photosensitivity performance, film-forming property and the like of the composition, solubility of the fullerene and the like. For example, the fullerene may be present in an amount of 0.001–10 parts by weight for 100 parts by weight of the polymer compound. However, the amount of the fullerene is not limited to this range.

Amount of the solvent may be also suitably decided considering kinds and ratio of the polymer compound and the fullerene and kind of the solvent.

The composition of the present invention can further contain a pigment if desired. Example of such a pigment include organic pigments, carbon black and the like.

The photosensitive resin composition of the present invention is cured by irradiating with light of visible range. This curing is considered to be caused because the Fullerton reacts with the functional group of the polymer compound and in addition one molecule of fullerene can react with a plurality of the functional groups, i.e., the fullerene functions as a crosslinking agent.

Nature of the light (wavelength, intensity) and irradiation time used for the curing can be suitably selected depending on the composition of the photosensitive resin composition.

In the method for forming negative type picture elements of the present invention, a layer containing a Fullerton and a polymer compound bearing a functional group which can react with the fullerene under irradiation of visible light can be formed by using the above photosensitive resin composition of the present invention. Film thickness of this photosensitive layer may be suitably selected, for example, from a range of 0.1–10 $\mu$m. When preparing the photosensitive layer, the layer may be pre-heated after it is coated, if desired.

Then, visible light is irradiated to this photosensitive layer through a photo mask having a pattern transmitting visible light as a part of the mask to cure portions of the layer irradiated by the visible light. The pattern or material of the photo mask are not particularly limited. Nature of the light (wavelength, intensity) and irradiation time used for the curing can be suitably selected depending on the composition of the photosensitive resin composition. For example, light in a wavelength range of 200–800 nm can be irradiated for 1 second to 10 minutes. Even visible light in a wavelength range of 400–800 nm can cure the layer sufficiently.

Subsequently, uncured portions of the photosensitive layer are removed to form a resist film having the pattern. This development process can be performed by, for example, using a solvent which can easily dissolve the uncured composition. Examples of such a solvent are those mentioned hereinabove for the use in the composition of the present invention.

Negative type picture elements can be formed by the development process described above.

In the method for producing devices of the present invention, a layer containing a Fullerton and a polymer compound bearing a functional group which can react with the Fullerton under irradiation of visible light (photosensitive layer) is formed on an image-forming layer provided on a substrate. This photosensitive layer may be similar to that used in the method for forming negative type picture elements described above. The substrate and the image-forming layer used in this method may be suitably selected from known ones.

Then, visible light is irradiated to this photosensitive layer through a photo mask having a pattern transmitting visible light as a part of the mask to cure portions of the layer irradiated by the visible light, and uncured portions of the photosensitive layer are removed to form a resist film having the pattern. These processes can be performed in manners similar to those of the method for forming negative type picture elements described above.

Subsequently, exposed portions of the image-forming layer are etched and the resist film is removed. The etching may be either dry or wet etching, and known etching methods can be used as they are. The resist film can also be removed by, for example, heating thereof.

Thus, devices can be produced.

EXAMPLES

The present invention will be further explained with reference to the following working examples.

Example 1

0.75 g of Fullerton $C_{60}$ of high purity (99.98%, Term Co., Ltd.) and 10.0 g of poly(methacrylic acid furan ester) synthesized in Reference Example 1 were dissolved in 50 ml of toluene to form a uniform solution, and 10.0 g of carbon black was dispersed in the solution to afford a pigment-dispersed solution. This solution was filtered through a filter having a pore size of 0.1 $\mu$m, spin-coated on a silicon wafer and preliminarily heated to 80° C. for 10 minutes to give a filmhaving a filmthickness of 1.5 $\mu$m. This film was irradiated with light (150 W Xe arc lamp and 530 nm cut colored glass filter were used) through a photo mask and then developed with toluene for 1 minute to afford a negative type picture element with line width of 5 $\mu$m or less.

Example 2

0.75 g of Fullerton $C_{60}$ of high purity (99.98%, Term Co., Ltd.) and 10.0 g of poly(methacrylic acid diethylamine ester) synthesized in Reference Example 1 were dissolved in 50 ml of benzonitrile to form a uniform solution, and 10.0 g of carbon black was dispersed in the solution to afford a pigment-dispersed solution. This solution was filtered through a filter having a pore size of 0.5 $\mu$m, spin-coated on a silicon wafer and preliminarily heated to 80° C. for 10 minutes to give a film having a film thickness of 1.5 $\mu$m. This film was irradiated with light (150 W Xe arc lamp) through a photo mask and then developed with benzonitorile for 1 minute to afford a negative type picture element with line width of 5 $\mu$m or less.

Comparative Example 1

1.0 g of bisazide compound and 10.0 g of methacrylic acid/methacrylic acid benzyl ester (weight ratio 25/75) copolymer were dissolved in 50 ml of methanol to form a uniform solution, and 10.0 g of carbon black was dispersed in the solution to afford a pigment-dispersed solution. This solution was filtered through a filter having a pore size of 0.5 $\mu$m, spin-coated on a silicon wafer and preliminarily heated to 80° C. for 10 minutes to give a film having a film thickness of 1.5 $\mu$m. This film was irradiated with light (150 W Xe arc lamp) through a photo mask and then immersed in a NaOH aqueous solution for 30 seconds. The whole film was dissolved and hence picture element could not be formed.

Example 3

0.75 g of Fullerton $C_{60}$ of high purity and 10.0 g of methacrylic acid/methacrylic acid furan ester (weight ratio 25/75) copolymer synthesized in Reference Example 2 were dissolved in 50 ml of toluene to form a uniform solution. This solution was filtered through a filter having a pore size of 0.1 $\mu$m, spin-coated on a silicon wafer and preliminarily heated to 80° C. for 10 minutes to give a film having a film thickness of 1.5 $\mu$m. This film was irradiated with visible light (150 W Xe arc lamp and 530 nm cut colored glass filter were used) through a photo mask and then developed with a NaOH aqueous solution for 1 minute to afford a negative type picture element with line width of 5 $\mu$m or less.

Comparative Example 2

1.0 g of bisazide compound and 10.0 g of methacrylic acid/methacrylic acid benzyl ester (weight ratio 25/75) copolymer were dissolved in 50 ml of methanol to form a uniform solution. This solution was filtered through a filter having a pore size of 0.1 $\mu$m, spin-coated on a silicon wafer and preliminarily heated to 80° C. for 10 minutes to give a film having a film thickness of 1.5 $\mu$m. This film was irradiated with visible light (150 W Xe arc lamp and 530 nm cut colored glass filter were used) through a photo mask and then immersed in a NaOH aqueous solution for 30 seconds. The whole film was dissolved and hence picture element could not be formed.

Example 4

0.072 g of fullerene $C_{60}$ of highpurity (99.98%, Term Co., Ltd.) and 1 g of poly(methacrylic acid furan ester) synthesized in Reference Example 1 were dissolved in 5 ml of 1,1,2,2-tetrachloroethane to form a uniform solution. Variations of storage elastic modulus G' and loss elastic modulus G" with time of this solution when irradiated with visible light (150 W Xe arc lamp and 530 nm cut colored glass filter were used) at room temperature were determined by a viscoelastometer. The results are shown in FIG. 1. From the results shown in FIG. 1, it can be seen that the storage elastic modulus G' increased with time and the solution changed into an elastic material.

Reference Example 1
Synthesis of poly(methacrylic acid furan ester)

30 g of 2-hydroxyethyl methacrylate and 0.1 g of azobisisobutyronitrile were dissolved in 100 ml of isopropanol and heated to 80° C. for 6 hours with stirring. Then, the reaction mixture was slowly poured into about 1 liter of n-hexanol, and coagulated precipitates were taken by filtration to obtain 24 g of poly(2-hydroxyethyl methacrylate) (number average molecular weight: about 50000, polystyrene standard) as white powder.

10 g of the obtained powder was dissolved in 50 ml of pyridine and added with 12 g of 2-furoyl chloride dropwise at room temperature with stirring. Stirring was further continued for about 12 hours. Then, the reaction mixture was washed with 2N hydrochloric acid and saturated aqueous solution of sodium hydrogencarbonate. As a result, 11.5 g of poly(methacrylic acid furan ester) was obtained as pale red powder. Physicochemical characteristics of the resulting poly(methacrylic acid furan ester) are shown in Table 1.

TABLE 1

| | |
|---|---|
| UV/vis, nm in $CH_2Cl_2$ | 250 |
| IR $cm^{-1}$ KBr disk | 3100 (furan) 1730 (ester) |
| $^1$H-NMR, δ 500 MHz, in $CDCl_3$ | 6.52 (s, 1 H) 7.26 (m, 2 H) |

Reference Example 2
Synthesis of Methacrylic acid/Methacrylic acid furan Ester Copolymer 25 g of methacrylic acid and 75 g of methacrylic acid furan ester were dissolved in 300 g of cellosolve acetate. 0.1 g of azobisisobutyronitrile (AIBN) was added to the resulting solution, and it was heated to 80° C. to perform polymerization for 6 hours. Then, the reaction mixture was slowly poured into n-hexanol, and coagulated precipitates were taken by filtration to quantitatively obtain methacrylic acid/methacrylic acid furan ester copolymer (number average molecular weight: about 50000, polystyrene standard) as white powder.

According to the present invention, novel photosensitive resin compositions which utilize a relatively small amount of fullerene and are curable with light of visible range can be provided. Moreover, use of these photosensitive resin compositions enables production of negative type picture elements and devices with light of visible range.

What is claimed is:

1. A photosensitive resin composition containing Fullerene and a polymer compound bearing a substituted or unsubstituted heterocycle; wherein the composition is curable by irradiating with visible light.

2. The composition of claim 1, wherein the heterocycle is a substituted or unsubstituted furan, thiophene or pyrrole ring.

3. The composition of claim 1, wherein the composition further contains a solvent capable of solubilizing the fullerene and the polymer compound.

4. The composition of claim 1, wherein the composition further contains a pigment.

5. The composition of claim 1, wherein the polymer compound is poly(methacrylic acid furan ester).

6. The composition of claim 5, wherein the poly (methacrylic acid furan ester) is a polymer having a unit represented by formula (4):

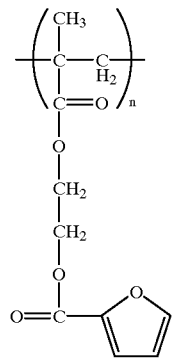

7. A composition comprising the reaction product of exposing the photosensitive resin composition of claim 1 to visible light to cause a reaction.

* * * * *